(12) United States Patent
Yamanaka et al.

(10) Patent No.: US 8,356,217 B2
(45) Date of Patent: Jan. 15, 2013

(54) STORAGE CIRCUIT, INTEGRATED CIRCUIT, AND SCANNING METHOD

(75) Inventors: Hitoshi Yamanaka, Kawasaki (JP);
Masahiro Yanagida, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 140 days.

(21) Appl. No.: 12/786,760

(22) Filed: May 25, 2010

(65) Prior Publication Data

US 2010/0332930 A1 Dec. 30, 2010

(30) Foreign Application Priority Data

Jun. 29, 2009 (JP) ................. 2009-154373

(51) Int. Cl.
*G01R 31/28* (2006.01)
*H03K 3/289* (2006.01)
(52) U.S. Cl. ........................ 714/726; 327/202
(58) Field of Classification Search .............. 714/724, 714/726, 729; 327/202
See application file for complete search history.

(56) References Cited

U.S. PATENT DOCUMENTS

| | | | | |
|---|---|---|---|---|
| 5,719,878 A * | 2/1998 | Yu et al. | | 714/726 |
| 6,023,778 A * | 2/2000 | Li | | 714/726 |
| 7,278,074 B2 * | 10/2007 | Mitra et al. | | 714/724 |
| 7,401,278 B2 * | 7/2008 | Verwegen | | 714/726 |
| 7,437,634 B2 * | 10/2008 | Jaber et al. | | 714/726 |
| 7,649,393 B2 * | 1/2010 | Maeda | | 327/198 |
| 7,650,549 B2 * | 1/2010 | Branch et al. | | 714/731 |
| 2007/0043989 A1 | 2/2007 | Yokota | | |

FOREIGN PATENT DOCUMENTS

| | | |
|---|---|---|
| JP | 54-055141 | 5/1979 |
| JP | 06-230075 | 8/1994 |
| JP | 2007-40921 | 2/2007 |
| JP | 2007-051936 | 3/2007 |

OTHER PUBLICATIONS

Kevin Stanley, "High-Accuracy Flush-and-Scan Software Diagnostic", IEEE Design & Test of Computers, vol. 18, pp. 56-62, No. 6, Nov./Dec. 2001.

* cited by examiner

*Primary Examiner* — James C Kerveros
(74) *Attorney, Agent, or Firm* — Staas & Halsey LLP

(57) ABSTRACT

A storage circuit, an integrated circuit and a scanning method are provided. The storage circuit includes a first storage element, and a second storage element connected to an output of the first storage element. The storage circuit includes a first setting circuit that is configured to set data of a first logic value to the first storage element when a clear signal is applied, and a second setting circuit that is configured to set data of a second logic value to the second storage element and transmit the second logic value data to a different storage circuit when a second clock signal is in an off state and the clear signal is applied.

7 Claims, 7 Drawing Sheets

FIG.6

| TIME | EVENT | FF100a | | FF100b | | FF100c | | FF100d | | FF100e | |
|---|---|---|---|---|---|---|---|---|---|---|---|
| | | master | slave | master | slave | master | slave | master | slave | master | slave |
| t1 | APPLY CL | 0 | 1 | 0 | 1 | 0 | 1 | 0 | 1 | 0 | 1 |
| t2 | APPLY ACK | 1 | 1 | 1 | 1 | 1 | 1 | 0 | 1 | 1 | 1 |
| t3 | APPLY BCK | 1 | 1 | 1 | 1 | 1 | 1 | 0 | 0 | 1 | 1 |
| t4 | APPLY ACK | 1 | 1 | 1 | 1 | 1 | 1 | 0 | 0 | 0 | 1 |
| t5 | APPLY BCK | 1 | 1 | 1 | 1 | 1 | 1 | 0 | 0 | 0 | 0 |
| ... | ... | ... | ... | ... | ... | ... | ... | ... | ... | ... | ... |

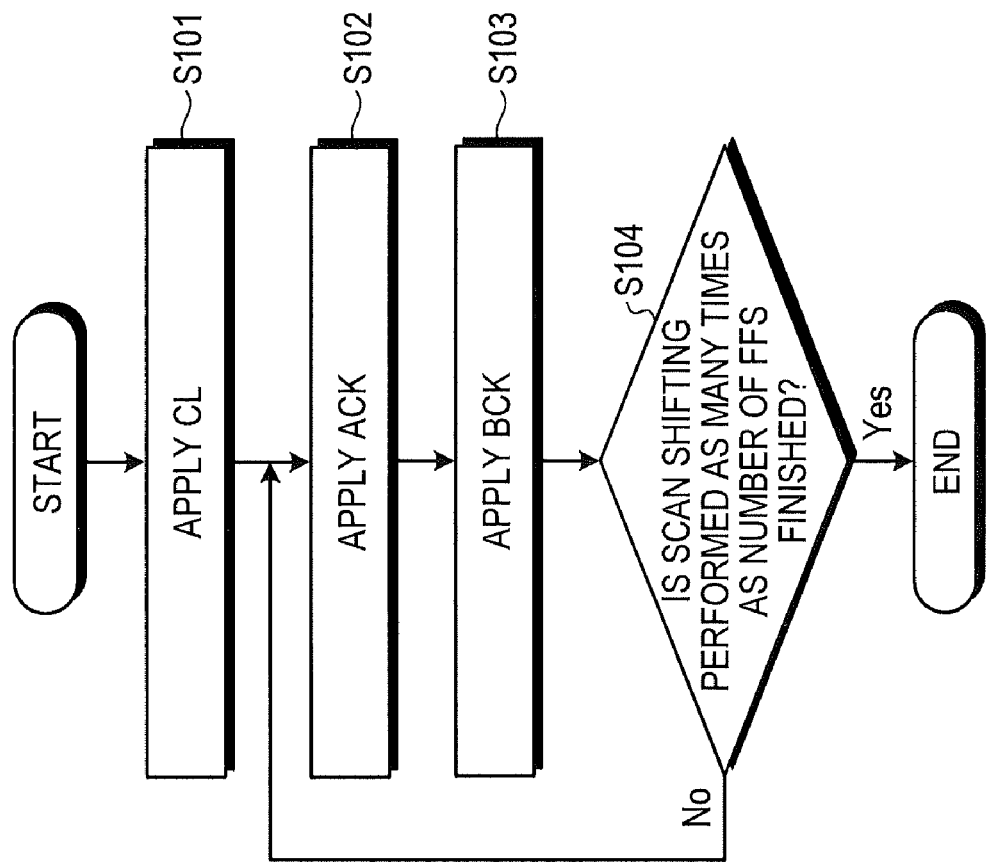

US 8,356,217 B2

STORAGE CIRCUIT, INTEGRATED CIRCUIT, AND SCANNING METHOD

CROSS-REFERENCE TO RELATED APPLICATION(S)

This application is related to and claims priority to Japanese Patent Application No. 2009-154373, filed on Jun. 29, 2009, and incorporated herein by reference.

FIELD

The embodiments discussed herein are related to a storage circuit, an integrated circuit, and a scanning method.

BACKGROUND

In the past, a scan test including, for example, level-sensitive scan design (LSSD) has been conducted on a manufactured circuit including a large scale integrated circuit (LSI) or the like. Methods for conducting the scan test are briefly described.

When conducting the scan test, every flip-flop (hereinafter referred to as an "FF") provided in a circuit targeted for verification is replaced by a scan FF including a scan latch and a scan interface, and the scan interfaces of the scan FFs are serially connected to one another via a path referred to as a "scan chain". Then, data is transmitted from a scan input of the scan interface of a predetermined scan FF and a shift operation is performed so that data is set to each of the scan FFs. The above-described data set to each of the scan FFs becomes data of an expected value. Then, scan shifting is performed to compare data transmitted from a scan output of the scan interface of the scan FF to the expected value data so that the circuit is inspected.

The above-described method can be performed at low cost. However, when a fault occurs, it is difficult to determine the fault occurrence spot through the above-described method. Consequently, it is difficult to determine in which part of the manufacturing process a problem occurs. In recent years, therefore, methods for setting an expected value for the scan FF have been devised. The methods include, for example, the method of providing a pin used to set data "0" to the scan FF in each of scan FFs so that an expected value "0" is set to each of the scan FFs when the power is turned on. The above-described method allows for determining the fault occurrence spot based on a difference between data transmitted from the scan output and the expected value.

The above-described method of setting the data "0" to the scan FF allows for detecting the fault occurrence spot when a "stuck-at-1 fault" occurs so that the expected value "0" set to the scan FF is changed to a value "1". However, the method does not allow for detecting the fault occurrence spot when a "stuck-at-0 fault" occurs so that the expected value "1" is changed into a value "0". Therefore, the method of providing a pin used to set data "1" to the scan FF in addition to the pin used to set the data "0" to the scan FF so that the data "0" and/or the data "1" is set to each of the scan FFs when the power is turned on has been devised. The above-described method allows for determining the spots where the "stuck-at-1 fault" and the "stuck-at-0 fault" had occurred.

However, a problem of the above-described known technologies is that a circuit scale using the above-described method becomes larger. More specifically, when the above-described known technologies are used, the pin used to set the data "0" and that used to set the data "1" are provided for each of the scan FFs to determine the spots where the "stuck-at-1 fault" and the "stuck-at-0 fault" had occurred. Particularly, since the pin used to set the data "1" is not usually provided for existing scan FFs, the circuit scale is increased to detect the "stuck-at fault 0".

Further, in addition to the above-described technologies, a method of analyzing the fault occurrence spot through software has been devised. When output data is degenerated due to a fault, the above-described method allows for propagating value data transmitted from the scan input onto the scan chain with no faults by applying the system clock pulse. Then, the result of measuring the propagated value data is compared to logic simulation data obtained by transmitting data of the degeneration fault onto the scan chain so that the spot where the degeneration fault had occurred is determined. However, depending on the fault occurrence spots, it has often been difficult to determine a scan FF where the fault had occurred.

SUMMARY

It is an aspect of the embodiments discussed herein to provide a storage circuit including a first storage element, a second storage element connected to an output of the first storage element, a first setting circuit that is configured to set data of a first logic value to the first storage element when a clear signal is applied, and that is configured to set data transmitted from a different storage circuit to the first storage element when a first clock signal is in an on state, and a second setting circuit that is configured to set data of a second logic value to the second storage element and transmit the second logic value data to a different storage circuit when a second clock signal is in an off state and the clear signal is applied, and that is configured to set the first logic value data set to the first storage element to the second storage element and transmit the first logic value data to a different storage circuit when the second clock signal is in an on state.

The object and advantages of the various embodiments will be realized and attained by means of the elements and combinations particularly pointed out in the claims.

It is to be understood that both the foregoing general description and the following detailed description are exemplary and explanatory and are not restrictive of the various embodiments, as claimed. These together with other aspects and advantages which will be subsequently apparent, reside in the details of construction and operation as more fully hereinafter described and claimed, reference being had to the accompanying drawings forming a part hereof, wherein like numerals refer to like parts throughout.

BRIEF DESCRIPTION OF DRAWINGS

FIG. 6 illustrates the example of the FF according to the first embodiment.

FIG. 7 illustrates scan test-processing procedures performed through the FF according to the first embodiment.

DESCRIPTION OF EMBODIMENTS

A storage circuit, an integrated circuit, and a scanning method are disclosed. A storage circuit, integrated circuit, and scanning method are not limited to those according to the above-described embodiment.

In a first embodiment, a storage circuit is exemplarily applied for an FF. An overview of the FF according to the first embodiment is disclosed, and the configuration of the FF according to the first embodiment is disclosed. An exemplary application of the FF is disclosed, and an exemplary scan test performed through the FF is disclosed.

Figure 1:
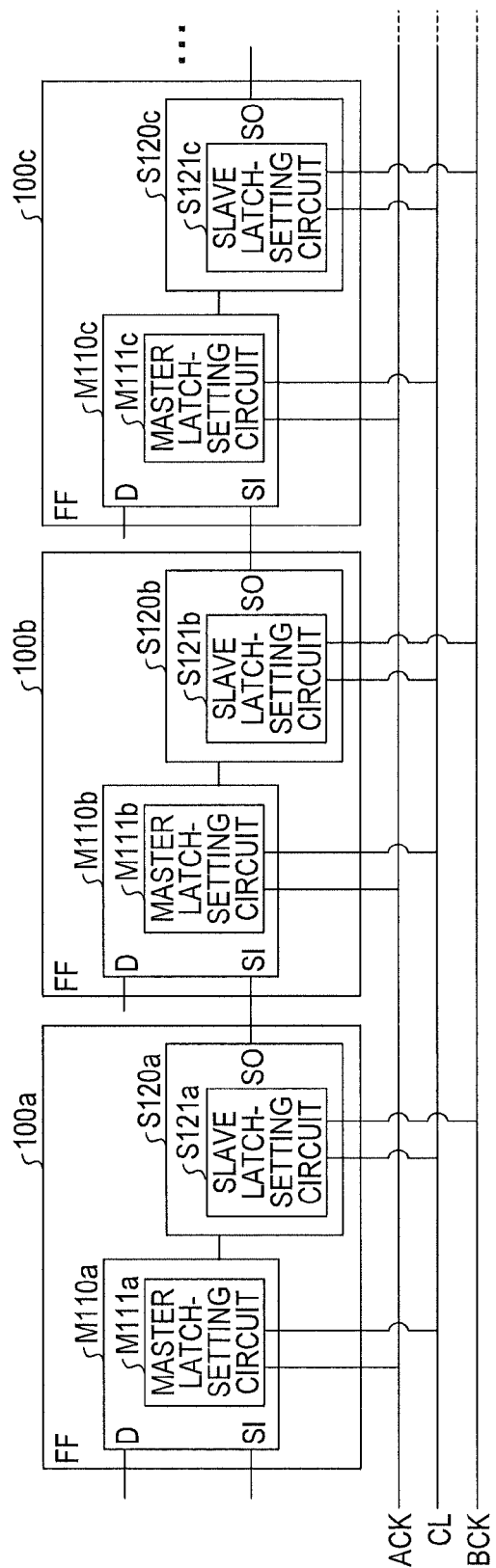
FIG. 1 illustrates a flip-flop ("FF") according to a first embodiment.

In an example illustrated in FIG. 1, FFs 100a, 100b, and 100c according to the first embodiment are serially connected to one another via a scan chain. The above-described FFs 100a to 100c may be included in an integrated circuit such as an LSI circuit.

As illustrated in FIG. 1, the FF 100a includes a master latch M110a and a slave latch S120a. The master latch M110a, operates as an input end, includes a scan input SI and a data input D. Further, the slave latch S120a, operates as an output end, includes a scan output SO.

FF 100b includes a master latch M110b and a slave latch S120b, and the FF 100c includes a master latch M110c and a slave latch S120c. Each of the master latches M110b and M110c includes a scan input SI and a data input D. Further, each of the slave latches S120b and S120c includes a scan output SO.

Further, as illustrated in FIG. 1, the scan input SI of each of the FFs may be connected to the scan output SO of the adjacent FF. In the example illustrated in FIG. 1, the scan output SO of the FF 100a is connected to the scan input SI of the FF 100b. Further, the scan output SO of the FF 100b is connected to the scan input SI of the FF 100c. Thus, the FFs are serially connected to one another.

As illustrated in FIG. 1, the master latches M110a to M110c include the individual master latch-setting circuits M111a, M111b, and M111c. Each of the master latches M110a to M110c includes a clear (CL) signal and a clock signal referred to as an A-clock (ACK) signal. The ACK signal is provided to control whether data transmitted from the slave latch of a different FF to the scan input SI is to be propagated to the master latch.

When the CL signal is applied, each of the master latch-setting circuits M111a to M111c sets data "0" to the master latch. For example, when the CL signal is applied, the master latch-setting circuit M111a sets the data "0" to the master latch M110a. When the CL signal is applied, the master latch-setting circuit M111b sets the data "0" to the master latch M110b and the master latch-setting circuit M111c sets the data "0" to the master latch M110c.

Further, when the ACK signal is applied (when the ACK signal is in the ON state), each of the master latch-setting circuits M111a to M111c sets data that shall be transmitted to the SI thereof to the master latch. For example, when the ACK signal is applied, the master latch-setting circuit M111b sets data that is transmitted from the slave latch S120a of the FF 100a and that shall be transmitted to the SI of the master latch-setting circuit M111b to the master latch M110b.

The slave latches S120a to S120c may include the individual slave latch-setting circuits S121a, S121b, and S121c as illustrated in FIG. 1. Each of the slave latches S120a to S120c accepts the CL signal and a clock signal referred to as a B-clock (BCK) signal. The BCK signal may be provided to control whether data transmitted from the master latch is to be propagated to the slave latch.

When the BCK signal is applied (when the BCK signal is in the ON state), each of the slave latch-setting circuits S121a to S121c sets data transmitted from the master latch to the slave latch and transmits the data from the SO thereof to the FF of the connection destination. For example, when the BCK signal is applied, the slave latch-setting circuit S121a sets data transmitted from the master latch M110a to the slave latch S120a, and transmits the data to the master latch M110b of the FF 100b.

When the BCK signal is not applied (when the BCK signal is in the OFF state) and the CL signal is applied, each of the slave latch-setting circuits S121a to S121c sets the data "1" to the slave latch and transmits the data "1" to the FF of the connection destination. For example, when the BCK signal is in the OFF state and the CL signal is applied, the slave latch-setting circuit S121a sets the data "1" to the slave latch S120a and transmits the data "1" to the master latch M110b of the FF 100b.

According to the above-described configuration, each of the FF 100a to 100c can retain both the data "0" and the data "1". More specifically, when the BCK signal is in the ON state and the clear signal is applied, the FF 100a to 100c retain the data "0" in the individual master latches M110a to M110c. Further, since the BCK signal is in the ON state, the slave latch-setting circuits S121a to S121c set the data "0" transmitted from the individual master latches M110a to M110c to the individual slave latches S120a to S120c. Consequently, each of the FFs 100a to 100c can retain the data "0".

Further, when the BCK signal is in the OFF state and the CL signal is applied, the FFs 100a to 100c retain the data "0" in the individual master latches M110a to M110c. Further, since the BCK signal is in the OFF state, each of the slave latch-setting circuits S121a to S121c sets the data "1" to the slave latch. When the ACK signal is applied to each of the FFs 100a to 100c after the above-described procedures, the data "1" retained in the slave latches S120a to S120c is propagated to the individual master latches M110b to M110c of the adjacent FFs. Consequently, each of the FFs 100a to 100c can retain the data "1".

Thus, when the BCK is in the ON state and the CL signal is applied to the FF according to the first embodiment, the FF can retain the data "0". Further, when the BCK is in the OFF state and the CL signal is applied to the FF, the FF can retain the data "1". Namely, when the scan test is performed through the FF according to the first embodiment, the spots where the stuck-at-0 fault and the stuck-at-1 fault had occurred can be determined.

For example, when performing the scan test, the CL signal is applied to the FF while the BCK signal is in the OFF state. Then, the ACK signal is applied to the FF so that the data "1" is set to the FF. Consequently, the spot where the stuck-at-0 fault had occurred can be determined through the scan test.

Further, when performing the scan test, the CL signal is applied to the FF while the BCK signal is in the ON state so that the data "0" is set to the FF. Consequently, the spot where the stuck-at-1 fault had occurred can be determined through the scan test.

Further, in the example illustrated in FIG. 1, each of the master latches M110a to M110c is provided as an example of a first storage element. Further, each of the slave latches S120a to S120c is provided as an example of a second storage element. Further, each of the master latch-setting circuits M111a to M111c is provided as a first second setting circuit. Further, each of the slave latch-setting circuits S121a to S121c may be provided as a second setting circuit.

Figure 2:
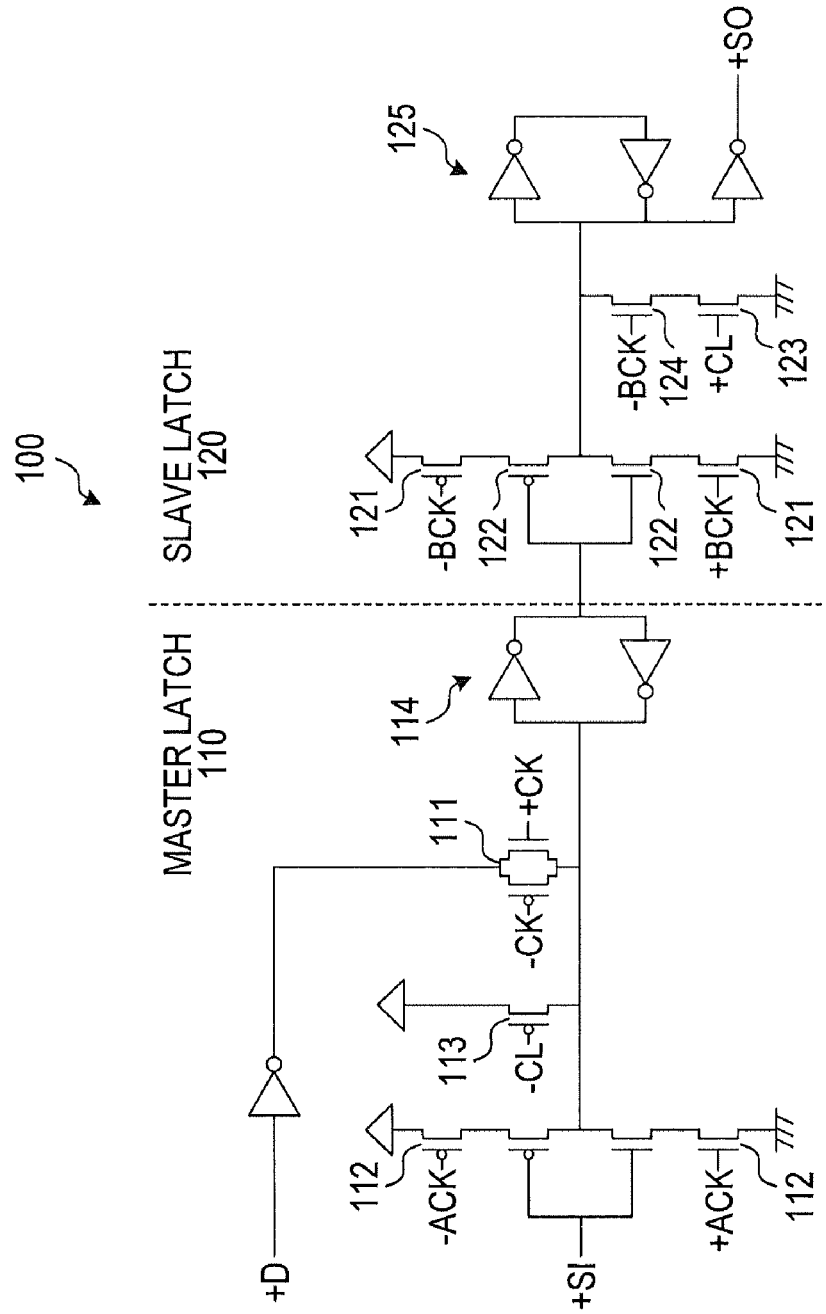
FIG. 2 illustrates the configuration of the FF according to the first embodiment.

FF 100 illustrated in FIG. 2 corresponds to each of the FFs 100a to 100c that are illustrated in FIG. 1.

As illustrated in FIG. 2, FF 100 includes a master latch 110 and a slave latch 120. The master latch 110 includes a data input D, a scan input SI, transistors 111, 112, and 113, and a NOT circuit 114.

Arbitrary data is transmitted to the data input D. In the transistor 111, the data propagation is controlled based on the CL signal. Since the data input D and the transistor 111 do not relate to an operation of the FF, the operation being performed during the scan test, the detailed description of the data input D and the transistor 111 will be omitted.

The scan input SI may be connected to the scan output SO of the adjacent FF and accepts data transmitted from the scan output SO of the adjacent FF. The data propagation of the transistor 112 is controlled based on whether the ACK signal is to be applied to the transistor 112. More specifically, when the ACK signal is applied to the transistor 112, data transmitted from the scan output SO of the adjacent FF is propagated through the scan input SI of the FF 100 connected to the above-described scan output SO and transmitted to the master latch 110 of the FF 100. On the other hand, when the ACK signal is not applied to the transistor 112, that is to say, when the ACK signal in the OFF state, data transmitted from the scan output SO of the adjacent FF is not propagated through the scan input SI and is not transmitted to the master latch 110 of the FF 100. Here, the transistor 112 is provided as an example of a master propagation element.

The transistor 113 is a transistor provided for a P channel (Pch) controlled based on a −CL signal which is a logic inverted signal of the CL signal. More specifically, the transistor 113 transmits the data "1" when the CL signal is applied thereto. The data "1" transmitted from the transistor 113 is transmitted to the NOT circuit 114. Here, the transistor 113 is provided as an example of a master setting element.

The NOT circuit 114 is a circuit performing a NOT operation. For example, when the CL signal is applied to the transistor 113, the data "1" is transmitted to the NOT circuit 14 as described above. Therefore, the data "0" is transmitted from the NOT circuit 114. Namely, when the CL signal is applied to the FF 100, the data "0" is retained on the master latch 110-side.

Further, the slave latch 120 includes a scan output SO, transistors 121, 122, 123, and 124, and a NOT circuit 125 as illustrated in FIG. 2.

The scan output SO of the slave latch 120 is connected to the scan input SI of the adjacent FF and transmits data to the scan input SI of the connection destination. When the ACK signal is applied to the master latch 110, data transmitted from the scan output SO of the FF connected to the scan input SI of the FF 100 is transmitted from the scan input SI of the FF 100 connected to the above-described scan output SO to the master latch 110 of the FF 100, as described above.

The data propagation of the transistor 121 is controlled based on whether the BCK signal is applied to the transistor 121. The transistor 122 connects the master latch 110 to the slave latch 120. When the BCK signal is applied to the slave latch 120, data transmitted from the NOT circuit 114 of the master latch 110 is transmitted to the slave latch 120. On the other hand, when the BCK signal is not applied to the slave latch 120, the data transmitted from the NOT circuit 114 of the master latch 110 is not propagated to the slave latch 120. Transistor 121 is as an example of a slave propagation element.

The transistor 123 is a transistor provided for an N channel (Nch) controlled based on a +CL signal. More specifically, when the CL signal is applied to the transistor 123, the transistor 123 propagates the data "0". The data propagation of the transistor 124 is controlled based on a −BCK signal which is a logic inverted signal of the BCK signal. The NOT circuit 125 is a circuit performing the NOT operation.

Therefore, when the BCK signal is applied to the slave latch 120, the transistor 124 does not propagate data to the NOT circuit 125 so that the data propagated from the transistor 123 is not transmitted to the NOT circuit 125. On the other hand, when the BCK signal is not applied to the slave latch 120, the transistor 124 propagates the data to the NOT circuit 125 so that the data propagated from the transistor 123 is transmitted to the NOT circuit 125. Here, each of the transistors 123 and 124 is provided as an example of a slave setting element.

When the CL signal is applied to the slave latch 120 while no BCK signal is applied, the data "0" is transmitted from the transistor 123 to the NOT circuit 125. Then, the NOT circuit 125 retains the data "1". Namely, when the BCK signal is not applied and the CL signal is applied to the slave latch 120, the data "1" is retained on the slave latch 120-side.

On the other hand, when the CL signal is applied to the slave latch 120 in the state where the BCK signal is applied, the data "0" propagated from the transistor 123 is not transmitted to the NOT circuit 125 and data transmitted from the master latch 110 is propagated to the NOT circuit 125. Since the master latch 110 retains the data "0" when the CL signal is applied as described above, the data "0" is transmitted from the master latch 110 to the transistor 122 and the data "1" is transmitted from the transistor 122 to the NOT circuit 125. Then, the NOT circuit 125 transmits the data "0" to the scan output SO. Namely, when the CL signal is applied to the slave latch 120 in the state where the BCK signal is applied, the data "0" is retained on the slave latch 120-side.

Thus, in the FF 100 according to the first embodiment, data retained on the slave latch 120-side can be switched between the data "0" and the data "1" according to whether the CL signal is applied when the BCK signal is not applied to the FF 100 or when the BCK signal is applied to the FF 100.

Figure 3:
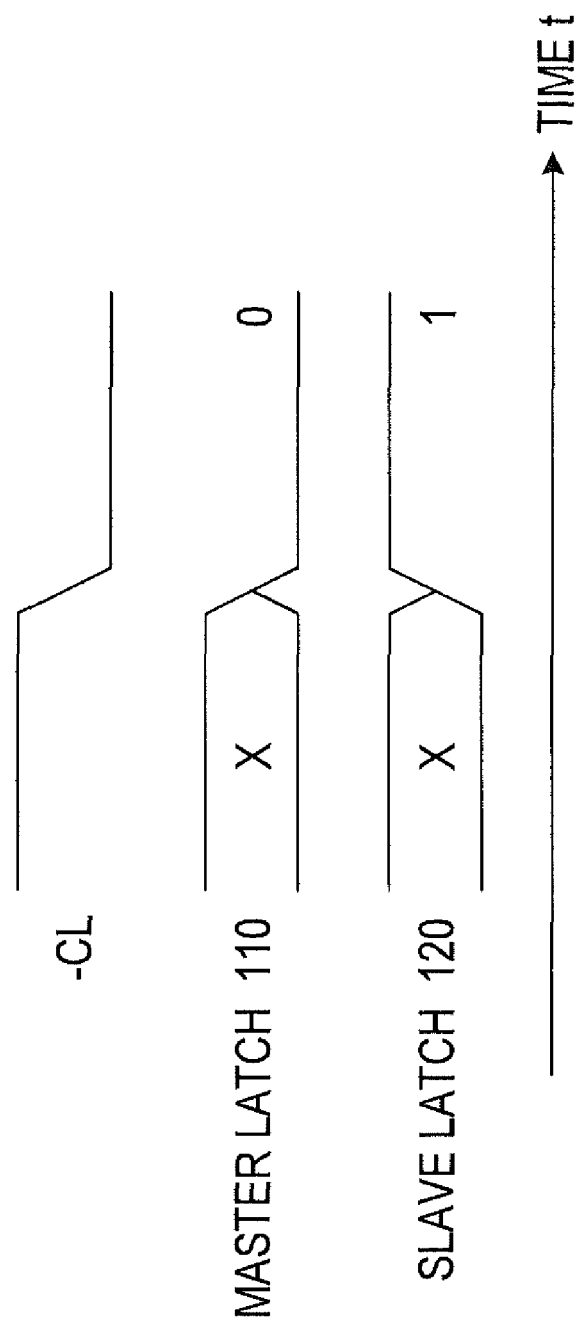
FIG. 3 illustrates an example of data retained in the FF when no B-clock ("BCK") signal is applied.
Figure 4:
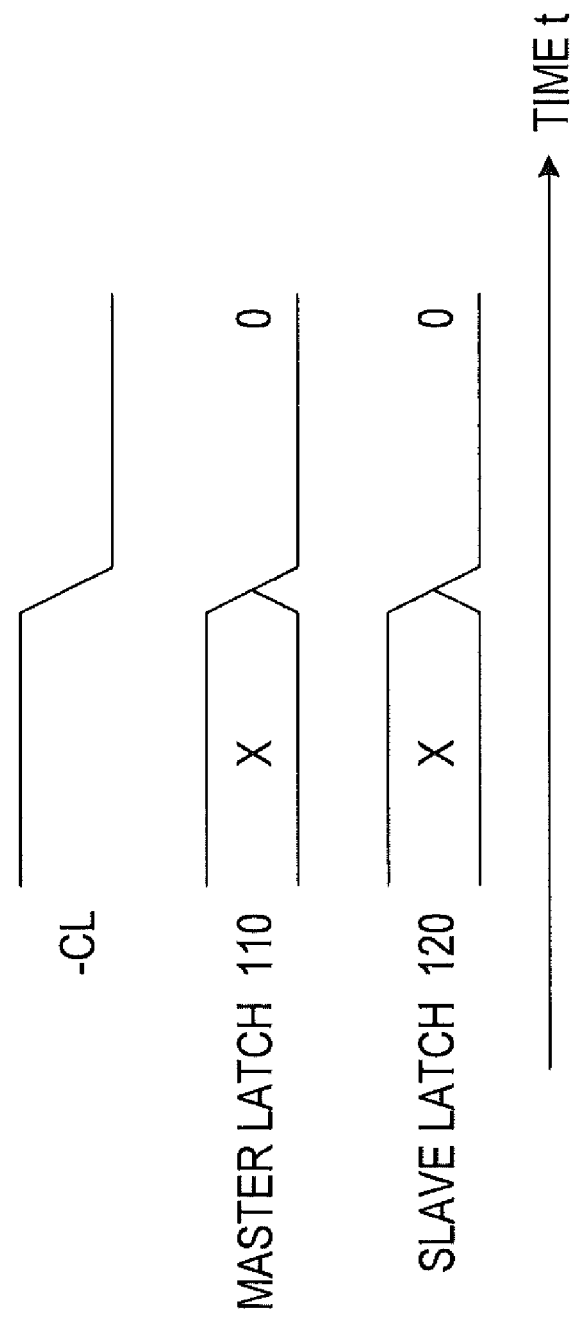
FIG. 4 illustrates an example of data retained in the FF when the BCK signal is applied.

FIG. 3 illustrates an example of the data retained in the FF 100 when the BCK signal is not applied to the FF 100. Further, FIG. 4 illustrates an example of the data retained in the FF 100 when the BCK signal is applied to the FF 100. In each of FIGS. 3 and 4, the ACK signal is not applied to the FF 100.

When the CL signal is applied to the FF 100 in the state where no BCK signal is applied, the data "0" is retained on the side of the master latch 110 of the FF 100 and the data "1" is retained on the slave latch 120-side as illustrated in FIG. 3. When the ACK signal is applied to the FF 100 after the above-described procedures, the data retained in the slave latch 120 is propagated to the master latch 110 of the adjacent FF 100 so that the data "1" is retained in the master latch 110 of the adjacent FF 100. Therefore, the FF 100 retains the data "1".

On the other hand, when the CL signal is applied to the FF in the state where the BCK signal is applied to the FF, the data "0" is retained on the side of the master latch 110 of the FF 100 and the data "0" is retained on the slave latch 120-side as illustrated in FIG. 4. Therefore, the data "0" is retained in the FF 100.

That is to say, the FF 100 according to the first embodiment can set the data "0" and/or the data "1". Therefore, it becomes possible to determine the spots where the stuck-at-0 fault and the stuck-at-1 fault had occurred through the scan test performed by using the FF 100 according to the first embodiment.

Figure 5:
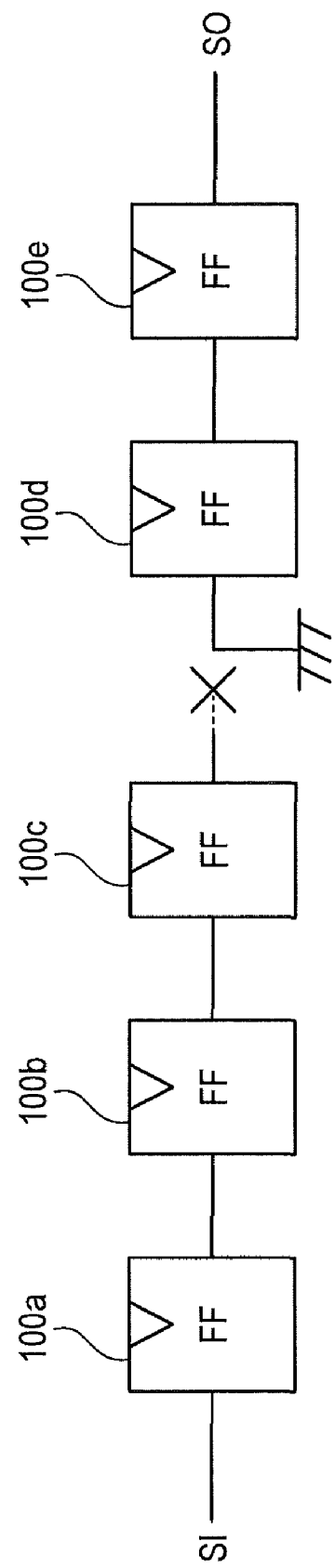
FIG. 5 illustrates an example of the FF according to the first embodiment.

An exemplary scan test performed to determine the spot where the stuck-at-0 fault had occurred by using the FF 100 according to a first embodiment is described with reference to FIGS. 5 and 6. FIGS. 5 and 6 illustrate an example of the application of the FF 100 according to the first embodiment. In FIG. 5, the FF 100a, the FF 100b, the FF 100c, an FF 100d, and an FF 100e are serially connected to one another. Further, FIG. 5 illustrates an example in which an error occurs in the connection between the FFs 100c and 100d.

Here, the condition of data retained in each of the FFs 100a to 100e when each of processing procedures that are illustrated in the column "event" illustrated in FIG. 6 is performed will be described. Here, the processing procedures are performed in the order of the time t1, the time t2, the time t3, the time t4, and the time t5 that are illustrated in FIG. 6. Value data retained in the slave latch of each of the FFs 100a to 100e becomes value data transmitted to the FF 100 provided in the next stage.

First, when the CL signal is applied to each of the FFs 100a to 100e at the time t1, the master latch of each of the FFs 100a to 100e retains the data "0" and the slave latch of each of the FFs 100a to 100e retains the data "1" as illustrated in FIG. 6.

When the ACK signal is applied to each of the FFs 100a to 100e at the time t2, data transmitted from the scan output SO of each of the FFs 100a to 100e is propagated through the scan input SI connected to the above-described scan output SO and is transmitted to the master latch of the connection destination. For example, data transmitted from the scan output SO of the FF 100a is transmitted to the master latch of the FF 100b and that transmitted from the scan output SO of the FF 100b is transmitted to the master latch of the FF 100c. That is to say, according to FIG. 6, an expected value set to each of the FFs 100a to 100e is illustrated as "11111 . . . ".

However, data transmitted from the scan output SO of the FF 100c is not transmitted to the master latch of the FF 100d due to the error occurring in the connection between the FFs 100c and 100d. Namely, as illustrated in the row of the time t2 indicated in FIG. 6, the data "1" retained in the slave latch of the FF 100c is not transmitted to the FF 100d so that the data "0" retained in the master latch of the FF 100d is left as it is.

When the BCK signal is applied to each of the FFs 100a to 100e at the time t3, the data is propagated from the master latch to the slave latch in each of the FFs 100a to 100e. For example, the data "1" is propagated from the master latch of the FF 100a to the slave latch and the data "1" is propagated from the master latch of the FF 100b to the slave latch.

In FIG. 6, however, the data "0" is retained in the master latch of the FF 100d. Therefore, the data "0" is propagated from the master latch of the FF 100a to the slave latch. Namely, the data "0" is retained in the slave latch of the FF 100d as illustrated in the row of the time t3 indicated in FIG. 6.

Thus, the ACK signal application and the BCK signal application are alternately performed for each of the FFs 100a to 100e so that scan shifting is performed. The data "11110 . . . " transmitted from the scan output SO of the FF 100e is compared to the expected value "11111 . . . " so that the spot where the stuck-at-1 fault had occurred can be determined. The determination attained in above-described embodiment will be described more specifically. Namely, of the data transmitted from the scan output SO of the FF 1003, data of the value attained at the time t5 is different from the expected value data. Accordingly, it becomes possible to determine that the stuck-at-0 fault occurs between the FFs 100c and 100d.

A scan test may be performed to determine a spot where the stuck-at-1 fault had occurred by applying the CL signal to the FF 100 according to the first embodiment in the state where the BCK signal is in the ON state.

Scan test processing procedures performed through the FF 100 according to the first embodiment are described with reference to FIG. 7. The scan test processing procedures may be performed to determine the spot where the stuck-at-0 fault had occurred.

The FFs 100 according to the first embodiment may be connected to one another via the scan chain. The CL signal is applied, while no BCK signal is applied, to each of the FFs 100 that are connected to one another via the scan chain at S101, as illustrated in FIG. 7. Consequently, the data "0" and the data "1" are retained in the individual master latch and slave latch of each of the FFs 100.

The ACK signal is applied to each of the FFs 100 at S102. Consequently, data transmitted from the scan output SO of each of the FFs 100 is propagated through the scan input SI of the adjacent FF connected to the above-described scan output SO and is transmitted to the master latch of the connection destination. Namely, the master latch of the FF retains data transmitted from the slave latch of the connection destination.

The BCK signal is applied to each of the FFs 100 at S103. Consequently, the data is propagated from the master latch to the slave latch in each of the FFs 100. Namely, the slave latch retains the data transmitted from the master latch.

Next, it may be determined whether the scan shifting is performed as many times as the number of the FFs connected to one another via the scan chain at S104. When the scan shifting is not performed as many times as the number of the FFs connected to one another via the scan chain, namely, when the answer is no at S104, the ACK signal is applied again to each of the FFs 100 at S102. Each of the FFs 100 performs the processing procedures corresponding to S102 and S103 until the scan shifting is performed as many times as the number of the FFs.

When the scan shifting is performed as many times as the number of the FFs that are connected to one another via the scan chain, namely, when the answer is yes at S104, data of the expected value set to each of the FFs 100 is compared to output data transmitted from the scan output SO of each of the FFs 100 so that the scan test is performed.

As described above, each of the FFs 100 according to the first embodiment can set both the data "0" and the data "1". Consequently, when the scan test is performed through the FF according to the first embodiment, the spots where the stuck-at-0 fault and the stuck-at-1 fault had occurred can be determined.

As illustrated in FIG. 2, each of the FFs 100 can set the data "1" through a control line including the transistors 123 and 124. Namely, the circuit scale of each of the FFs 100 may be smaller than that of a known FF provided with a pin used to set the data "1". Thus, the mere addition of the control line including the transistors 123 and 124 to each of the FFs 100 according to the first embodiment allows for determining the spots where the stuck-at-0 fault and the stuck-at-1 fault had occurred.

The storage circuit, the integrated circuit, and the scanning method may be achieved in various and different modes without being limited to the above-described embodiment. Therefore, a storage circuit, an integrated circuit, and a scanning method according to other embodiments are disclosed.

Of the processing procedures described in the above-described embodiment, all or part of the automatically performed processing procedures may be manually performed. Otherwise, all or part of the manually performed processing procedures may be automatically performed according to a known method. Further, the processing procedures, the control procedures, the specific names, and the information including various data and/or parameters that are illustrated in the above-described embodiments and/or the attached drawings may be arbitrarily changed apart from specified cases.

Exemplary components of each of the illustrated devices are functionally illustrated in the drawings, and may not be physically configured as illustrated. Namely, the specific form of distribution and/or integration of the devices is not limited to those illustrated in the drawings, and all or part of the devices may be distributed and/or integrated functionally and/or physically in an arbitrary unit based on various loads and/or service conditions. Further, all or arbitrary part of the processing operations performed in the devices may be achieved through a CPU and/or a program which is analyzed and executed through the CPU, or may be achieved as hardware attained based on wired logic.

The embodiments can be implemented in computing hardware (computing apparatus) and/or software, such as (in a non-limiting example) any computer that can store, retrieve, process and/or output data and/or communicate with other computers. The results produced can be displayed on a display of the computing hardware. A program/software implementing the embodiments may be recorded on non-transitory computer-readable media comprising computer-readable recording media. Examples of the computer-readable recording media include a magnetic recording apparatus, an optical disk, a magneto-optical disk, and/or a semiconductor memory (for example, RAM, ROM, etc.). Examples of the magnetic recording apparatus include a hard disk device (HDD), a flexible disk (FD), and a magnetic tape (MT). Examples of the optical disk include a DVD (Digital Versatile Disc), a DVD-RAM, a CD-ROM (Compact Disc-Read Only Memory), and a CD-R (Recordable)/RW.

Further, according to an aspect of the embodiments, any combinations of the described features, functions and/or operations can be provided.

The many features and advantages of the embodiments are apparent from the detailed specification and, thus, it is intended by the appended claims to cover all such features and advantages of the embodiments that fall within the true spirit and scope thereof. Further, since numerous modifications and changes will readily occur to those skilled in the art, it is not desired to limit the inventive embodiments to the exact construction and operation illustrated and described, and accordingly all suitable modifications and equivalents may be resorted to, falling within the scope thereof.

What is claimed is:

1. A storage circuit comprising:
a first storage element;
a second storage element connected to an output of the first storage element;
a first setting circuit configured to set data of a first logic value to the first storage element when a clear signal is applied, and configured to set data transmitted from a different storage circuit to the first storage element when a first clock signal is in an on state; and
a second setting circuit configured to set data of a second logic value to the second storage element and transmit the second logic value data to a different storage circuit when a second clock signal is in an off state and the clear signal is applied, and configured to set the first logic value data to the second storage element and transmit the first logic value data to a different storage circuit when the second clock signal is in an on state.

2. The storage circuit according to claim 1,
wherein the first logic value is a value "0", and
wherein the second logic value is a value "1".

3. A storage circuit comprising:
a first latch;
a second latch connected to an output of the first latch;
a master setting element configured to set data of a first logic value to the first latch when a clear signal is applied;
a master propagation element configured to propagate data transmitted from a different storage circuit to the first latch when a first clock signal is in an on state;
a slave propagation element configured to propagate data transmitted from the first latch to the second latch when a second clock signal is in an on state; and
a slave setting element configured to set data of a second logic value to the second latch when the second clock signal is in an off state and the clear signal is applied.

4. The storage circuit according to claim 3,
wherein the first logic value is a value "0", and
wherein the second logic value is a value "1".

5. An integrated circuit comprising:
a first storage element;
a second storage element connected to an output of the first storage element;
a first setting circuit configured to set data of a first logic value to the first storage element when a clear signal is applied and configured to set data transmitted from a different storage circuit to the first storage element when a first clock signal is in an on state; and
a second setting circuit configured to set data of a second logic value to the second storage element and transmit the second logic value data to a different storage circuit when a second clock signal is in an off state and the clear signal is applied, and configured to set the first logic value data set to the first storage element through the first setting circuit to the second storage element and transmit the first logic value data to a different storage circuit when the second clock signal is in an on state.

6. The integrated circuit according to claim 5,
wherein the first logic value is a value "0", and
wherein the second logic value is a value "1".

7. A scanning method comprising:
setting data of a first logic value to a first storage element when a clear signal is applied;
setting data transmitted from a storage circuit to the first storage element when a first clock signal is in an on state;
setting data of a second logic value to a second storage element;
transmitting the second logic value data to a storage circuit when a second clock signal is in an off state and the clear signal is applied; and
setting the first logic value data to the second storage element and transmitting the first logic value data to a storage circuit when the second clock signal is in an on state.

* * * * *